United States Patent [19]

Prost et al.

[11] Patent Number: 4,749,984

[45] Date of Patent: Jun. 7, 1988

[54] SUBRANGING A/D CONVERTER WITH CONVERGING DIGITALLY CONTROLLED VOLTAGES

[75] Inventors: Kalman J. Prost, East Stroudsburg; John L. Bradshaw, Hatboro, both of Pa.

[73] Assignee: RCA Corporation, Princeton, N.J.

[21] Appl. No.: 67,186

[22] Filed: Jun. 29, 1987

[51] Int. Cl.$^4$ .............................................. H03M 1/36
[52] U.S. Cl. ........................... 340/347 AD; 324/99 D; 340/347 M
[58] Field of Search ....... 340/347 AD, 347 M, 347 C, 340/347 CC; 324/99 D

[56] References Cited

U.S. PATENT DOCUMENTS

| | | | |
|---|---|---|---|
| 4,122,439 | 10/1978 | Ninomiya | 340/347 AD |
| 4,189,714 | 2/1980 | Adam | 340/347 AD |
| 4,276,543 | 6/1981 | Miller et al. | 340/347 AD |
| 4,635,036 | 1/1987 | Yoshizawa | 340/347 AD |
| 4,641,129 | 2/1987 | Doluca et al. | 340/347 AD |

OTHER PUBLICATIONS

Hnatek, A User's Handbook of D/A and A/D Converters, 1976, J. Wiley & Sons, pp. 20 & 21.
The Engineering Staff of Digital Equipment Corp., Analog-Digital Conversion Handbook, 1964, pp. 20-22.
The Engineering Staff of Analog Devices, Inc., Analog-Digital Conversion Handbook, 6/1972, pp. I-54 to I-57.
Nordstrom, High-Speed Integrated A/D Converter, 1976 IEEE International Solid-State Circuits Conference, Digest of Technical Papers, pp. 150 & 151.
"High Linearity and Video Speed Come Together in A-D Converters", by Pratt, Electronics magazine, Oct. 9, 1980, pp. 167-170.
Basic D/A techniques are Summarized in the Datel Systems, Inc., Engineering Goldbook 76/77, vol. 3, pp. 12-16.

Primary Examiner—T. J. Sloyan
Attorney, Agent, or Firm—Clement A. Berard, Jr.; William H. Meise

[57] ABSTRACT

A subranging A/D converter generates high and low voltages using first and second DACs. A voltage divider receives the high and low voltages to generate plural reference voltages. A bank of comparators compares the analog voltage which is to be converted to each of the reference voltages, and a clocked logic circuit generates an intermediate digital signal indicative of the analog value relative to the plural reference voltages. The intermediate signal is used to decrement the high voltage and increment the low voltage, so that the reference voltages produced by the voltage divider assume subrange values. The process is repeated for as many clock cycles as is required to converge the high and low voltages to equal the analog voltage.

1 Claim, 10 Drawing Sheets

STARTING CONDITION

CLOCK 2

SUBRANGING A/D CONVERTER WITH CONVERGING DIGITALLY CONTROLLED VOLTAGES

BACKGROUND OF THE INVENTION

This invention relates to analog-to-digital (A-to-D) converters and, more particularly, to such converters which provide trade-offs between the number of comparators and operating speed.

Analog-to-digital converters (ADC) are widely used for converting analog signal voltages into a plurality of coded binary (two-level) signals, ordinarily known as digital signals. The history of such converters includes requirements for progressively higher operating speeds, in order to accommodate analog signals having progressively higher frequencies. High operating speeds are provided by the well-known flash converter. The flash converter includes N-1 comparators, where N is the number of distinct levels or states represented by the binary number, for producing N-1 unencoded binary signals, which are encoded by an encoding logic circuit to produce the desired digital signal. Such flash converters can make a conversion in one clock cycle, but tend to require relatively high power because of the large number of comparators required, which is one less than the number of possible states of the digital signal (255 comparators for conversion to an 8-bit digital signal). A 12-bit flash converter would require 4095 comparators. Practical limitations make converters for more than eight bits unwieldy at the present state of the art.

The number of comparators is reduced in the subranging or half-flash converter. An 8-bit half-flash converter uses 15 comparators (four bits) to produce a first intermediate digital signal. The first 4-bit intermediate signal represents the four most significant bits (MSB) of the desired digital output signal. The first intermediate signal is then converted back to an analog form for subtraction from the input signal to produce a difference signal. The difference signal is amplified to drive a second 4-bit flash converter which produces the four least significant bits of the output digital signal. The overall conversion operation requires two clock cycles. The half-flash converter has an accuracy which depends upon the accuracy of the analog substractors and of the amplifiers required to amplify the difference signal. Thus, the half-flash converter has fewer comparators than the full flash converter, but requires accurate analog subtractors and amplifiers in order to provide accurate conversion, and, furthermore, requires a longer time for conversion.

The successive approximation type of converter resolves one bit during each clock cycle, starting with the most significant bit. This type of converter requires one clock cycles to resolve eight bits.

An analog-to-digital converter is desired in which fewer comparators are required than for a full flash converter, which does not require accurate analog subtractors and amplifiers, and which is faster than the successive approximation converter.

SUMMARY OF THE INVENTION

An A-to-D converter for converting an analog signal voltage into a digital signal includes digitally controllable first and second generators for producing first and second voltages in response to digital words applied to their input ports. A voltage divider is coupled between the first and second voltage generators for producing a plurality of reference voltages between the first and second voltages. A comparator and processor arrangement is coupled to the voltage divider and is adapted for receiving the analog signal voltage for comparing the analog signal voltage with the plurality of reference voltages for generating an intermediate or partial digital signal. An arrangement is provided for preapplying to the input port of the first voltage generator a first digital word including a plurality of logic high levels in at least the most significant bit locations for producing a relatively high first voltage at the time of initiation of conversion. Means are also supplied for preapplying to the input port of the second voltage generator a second digital word including a plurality of logic low levels in at least the most significant bit locations for producing a relatively low second voltage at the time of initiation of conversion. Thus, the first intermediate digital signal assumes a value which is coarsely indicative of the value of the analog signal voltage relative to the difference between the first and second voltages. A substituting arrangement is coupled to the comparator and processor and to the first voltage generator for substituting the first intermediate signal for the first digital word preapplied to the most significant bits of the input port of the first voltage generator, whereby the first voltage assumes a value slightly larger than the analog signal voltage. The substituting arrangement is also coupled to the comparator and processor and to the second voltage generator for substituting the first intermediate digital signal for the second digital word preapplied to the most significant bits of the input port of the second voltage generator, whereby the second voltage assumes a value slightly smaller than the analog signal voltage, and the comparator and processor then generates a second intermediate digital signal. The output digital signal is generated with the first intermediate digital signal in its most significant bits and with the second intermediate digital signal in less significant bits.

DESCRIPTION OF THE INVENTION

Figure 1:
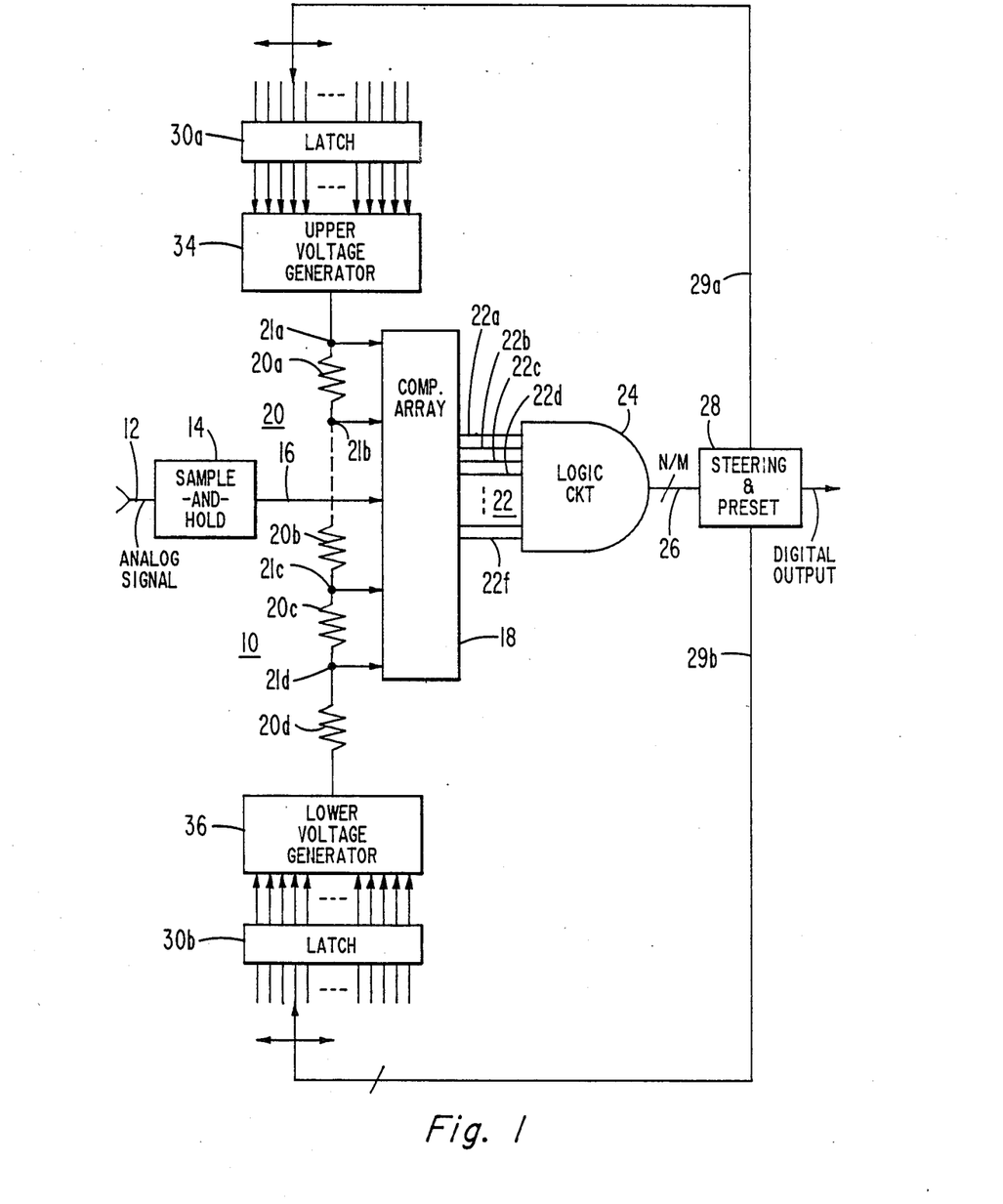
FIG. 1 is a simplified block diagram of an analog-to-digital converter in accordance with the invention.

FIG. 1 is a simplified, block diagram of an analog-to-digital converter (ADC) 10 is accordance with the invention. In FIG. 1, an analog signal to be converted into digital form is applied by way of an input terminal 12 to a sample-and-hold (S&H) circuit illustrated as a block 14. As described below, ADC 10 requires a particular number of clock cycles to complete a conversion. Sample-and-hold 14 samples the analog signal applied to terminal 12 on a particular clock cycle, and holds the sample for the duration of the conversion process. The analog signal sample produced by S&H 14 is applied by way of a conductor 16 to an array of comparators illustrated as a block 18.

Comparator array 18 compares the signal sample on conductor 16 with a plurality of reference voltages produced by a voltage divider designated generally as 20. Voltage divider 20 includes a string of resistors 20a, 20b . . . 20d, and a set of nodes 21 (21a, 21b . . . 21d) associated with each resistor. The reference voltages are generated at nodes 21a-d. Each comparator of array 18 responds to the voltage at one of nodes 21a-d and to the applied analog signal, and produces a logic high (logic 1 or logic one) or a logic low (logic 0 or logic zero) level on one conductor 22a, 22b . . . 22f of a set of conductors 22. The outputs of comparator array 18 on conductor set 22 together constitute an unencoded intermediate signal, which is applied to an encoding logic circuit illustrated as 24 for conversion into an intermediate binary signal having fewer bits than the bits of the desired conversion.

For example, if it is desired to convert the analog signal into a digital signal having N bits, the intermediate digital signal produced by logic circuit 24 on conductor set 26 may have N/M bits, where M is a positive integer. As a more specific example, if the digital output signal of converter 10 has 12 bits, N=12, and if M=6 the intermediate digital signal on conductor 26 will have 12/6=2 bits.

Conductor 26 is an N/M-bit conductor set. For simplicity and in keeping with conventional representation, it is shown as a single conductor. Those skilled in the art known that digital signals may be conducted in serial or in parallel form, and that when digital signals are handled in a parallel format, multiple conductors are required. No distinction is hereafter made between single and multiple conductors. The N/M bits on conductor 26 are applied to a steering and preset arrangement illustrated as a block 28 which, as described below in conjunction with FIGS. 3 and 4, presets the inputs of first and second N-bit latches 30a and 30b, and successively applies the intermediate digital signal of N/M bits in succession to the inputs of first latch 30a and second latch 30b, starting with the N/M most significant bits of each. Certain bits stored in latches 30a and 30b are preset at the beginning of each conversion cycle and at intermediate steps during the conversion, beginning with the N/M most significant bits. The preset of the N/M bits of latch 30a is all-ones (111 . . . 11), and the preset of the N/M most significant bits in latch 30b is all-zeroes (000 . . . ). During each step of the conversion cycle, latch 30 applies the signal then latched therein to a digitally controlled upper voltage generator 34, and latch 32 applies the signal then latched therein to a digitally controlled lower voltage generator 36. At each successive step during the process of conversion, the voltage produced by upper voltage generator 34 decreases toward the sampled analog voltage on conductor 16, and the voltage produced by lower voltage generator 36 increases, so that the upper and lower voltages produced by upper and lower voltage generators 34 and 36 converge toward each other and toward the analog voltage being converted. The upper voltage is coupled to node 21a at the upper end of voltage divider 20, and the lower voltage is coupled to the lower end of a resistor 20d at the lower end of the voltage divider.

Analog-to-digital converter 10 is advantageous by comparison with a flash converter in that it requires relatively few comparators in comparator array 18. In the above-mentioned specific example, when the number of bits N in the digital output signal is 12 and the value of M is 6, the intermediate digital signal on conductor 26 is a 2-bit signal, and comparator array 18 requires only three comparators to resolve the four possible states represented by the two-bit intermediate digital signal. A conversion requires M clock cycles. Therefore, the 12-bit conversion requires six clock cycles when M=6. As another example, for the case of a 12-bit digital output signal and a value of M=3, the intermediate digital signal on conductor set 26 has four bits (N/M=12/3=4) representing 16 possible states, and comparator array 18 therefore requires 15 comparators to produce the four bit intermediate digital signal. However, the M=3 version completes the 12-bit conversion in only three clock cycles. Furthermore, the ADC according to the invention does not require analog substractors or amplifiers. The ADCs according to the invention can be seen to be amendable to advantageous tradeoffs between complexity and operating speed.

Figure 2:
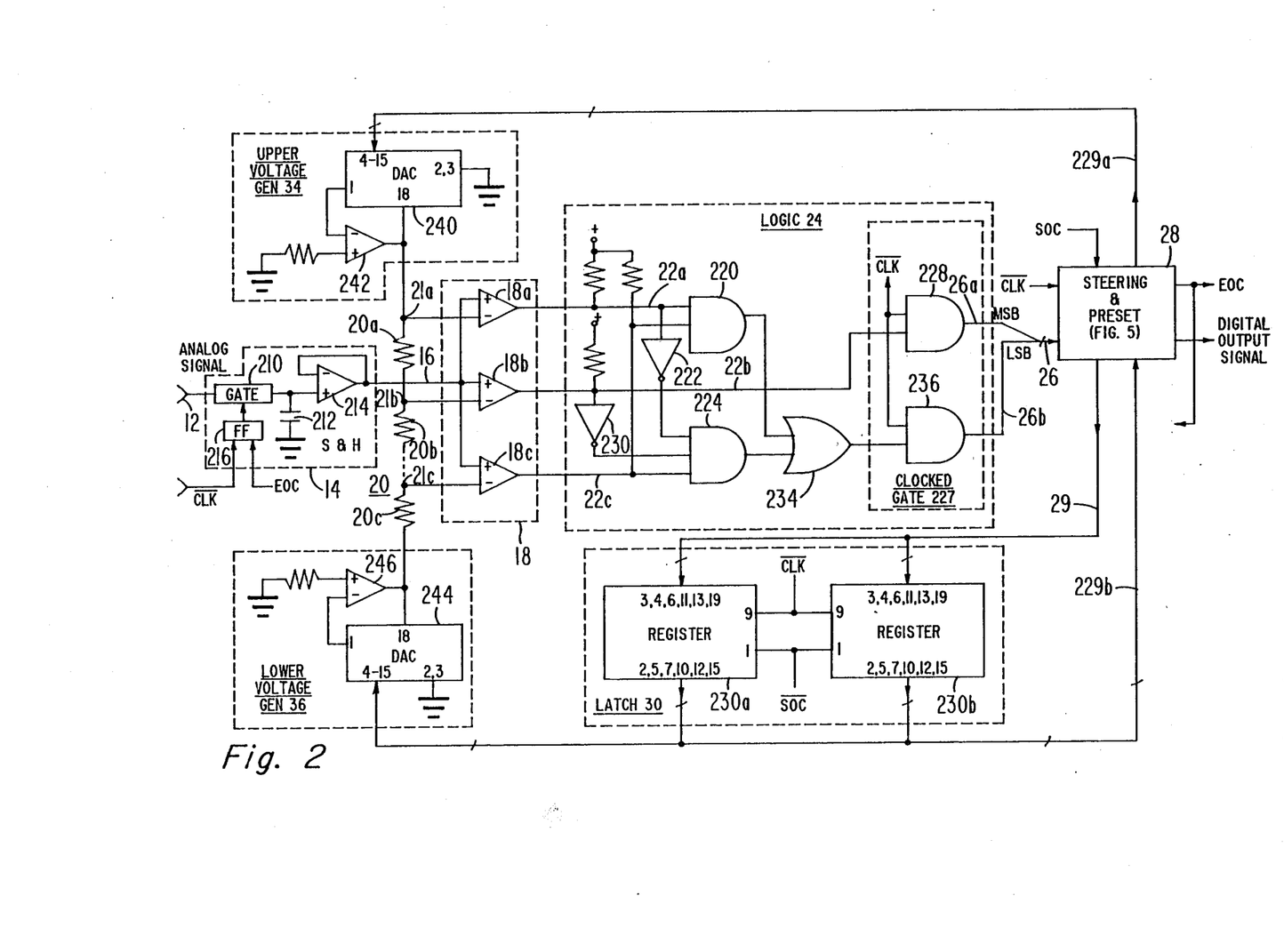
FIG. 2 is a simplified schematic diagram of a portion of the arrangement of FIG. 1.

FIG. 2 is detailed schematic diagram of a portion of the arrangement of FIG. 1. In FIG. 2, elements corresponding to those of FIG. 1 are designated by the same reference numerals. It should be noted that a single latch 30 is used in the arrangement of FIG. 2, rather than two latches. FIG. 2 is configured for an intermediate digital signal having two bits, and for a 12-bit output digital signal. In FIG. 2, the analog signal applied to input terminal 12, which is to be converted into digital form, is coupled through a sampling transmission gate 210 of S&H 14 to a holding capacitor 212 in response to an inverted clock ($\overline{CLK}$) signal momentarily coupled through a flip-flop (FF) 216, which thereafter remains blocked until receipt of an end-of-conversion (EOC) signal. Buffer amplifier 214 presents a high impedance to capacitor 212 so that capacitor 212 holds the sampled analog signal for the duration of the conversion. The sampled analog signal held on capacitor 212 is available on conductor 16, and is applied in parallel to the noninverting (+) input terminals of comparators 18a, 18b, and 18c which are part of comparator array 18. As illustrated, the possibility of adding more comparators in order to resolve intermediate digital signals of more than two bits is indicated by the dash lines between comparators 18b and 18c.

As described below, the upper voltage applied to the upper end of voltage divider 20 is at least higher (more positive) than half of the highest analog signal voltage expected to be received for conversion, and the lower voltage applied to the lower end of voltage divider 20 is lower (more negative) than the lowest value to be expected. Comparators 18a-18c compare the sampled analog signal on conductor 16 with the reference voltages produced by voltage divider 20 on nodes 21a-21c to produce an unencoded signal including a logic one level at the outputs of all comparators coupled to reference voltages having a value lower than the sampled analog voltage on conductor 16, and to produce a logic zero level at the outputs of all comparators coupled to reference voltages having a value higher than the sampled analog signal.

The outputs of comparators 18a, 18b and 18c are coupled to encoding logic circuit 24, which as illustrated is configured to convert the four possible states of the three comparator outputs into a two-bit intermediate digital signal, also having four possible states. The output of comparator 18a is connected by way of conductor 22a to the inputs of an AND gate 220 and of an inverter 222, the output of which is connected to the input of a further AND gate 224. The output of comparator 18b is coupled over a conductor 22b to the input of an AND gate 228 of a clocked gating circuit 227. The output of comparator 18b on conductor 22b is also applied by way of an inverter 230 to another input of AND gate 224. The output of comparator 18c is connected by way of conductor 22c to further inputs of AND gates 220 and 224. AND gates 220 and 224 have their outputs coupled by way of an OR gate 234 to an AND gate 236 of clocked gate 227. Gates 228 and 236 are enabled or clocked by $\overline{CLR}$ signal (described below), to produce on conductors 26a and 26b, respectively, of conductor set 26, the MSB and LSB, respectively, of the encoded intermediate digital signal for application to steering and preset circuit 28.

As described below in conjunction with FIG. 5, steering and preset circuit 28 in conjunction with latch 30 presets with logic 1 levels at least the two most significant bits of a digital-to-analog converter (DAC) 240, which is part of upper voltage generator 34. DAC 240 is a type AD7531 integrated circuit manufactured by Analog Devices, Inc. which coacts with an operational amplifier (op amp) 242 to produce the desired upper voltage at pin 18 for application to node 21 at the upper end of voltage divider 20 in response to the digital word applied to input pins 4 through 15.

Latch 30 includes a first static register 230a, which is configured as a six-bit type CD40174 type manufactured by RCA Corporation Solid State Division. A second like register 230b is interconnected with register 230a at pins 1 and 9 to form a 12-bit ensemble for use when a 12-bit output signal is required. Similarly, steering and preset circuit 28, in conjunction with latch 30, preloads at least the most significant bits of a DAC 244 (also on Analog Devices AD7531 and part of lower voltage generator 36) with logic 0 levels. DAC 244 coacts with an op amp 246 to produce on output pin 18 the lower voltage for application to the lower end of voltage divider 20.

In operation during each clock cycle of the conversion process, comparator array 18 compares the sampled analog signal with reference voltages which are fixed proportions of the difference between the upper and lower voltages, and produces unencoded binary signals which encoding or logic circuit 24 converts into an intermediate digital signal on conductor set 26. During successive clock cycles of each A-to-D conversion process, steering and preset arrangement 28 successively applies the intermediate digital signal of N/M bits to the next less significant N/M bit set of storage latch 30, and presets the next further less significant N/M bit set of DAC 240 to an all-ones condition, while leaving the remaining lesser significant bits of DAC 244 in an all-zeroes condition.

The operation of the invention is explained in greater detail by reference to FIG. 3, which represents a circuit similar to FIGS. 1 and 2 under various operating conditions during the conversion of an arbitrarily selected analog signal into a 6-bit digital signal by means of a two-bit intermediate digital signal, accomplished during three clock cycles.

FIG. 3 is similar to FIG. 1, and elements of FIG. 3 corresponding to those of FIG. 1 are designated by the same reference numerals. FIG. 3 is also similar to FIG. 2 in that logic circuit 24 is arranged to produce a two-bit intermediate digital signal on conductor set 26. As described in conjunction with FIG. 2, for this condition, logic circuit 24 requires an input having four possible states, which is provided by three comparators in comparator array 18. As illustrated in FIG. 3a, the starting condition (before the first clock pulse) has all-zeroes loaded into latch 30b, with the result that lower voltage generator 36 applies zero voltage (zero times a reference voltage $V_R$ or $0V_R$) to the lower end of voltage divider 20. The two most significant bits (the left-most bits) of latch 30a are preloaded with the two-bit digital word 11, and the remaining four bits are all 0. Since the most significant bit of the preload of latch 30a represents $\frac{1}{2}$ of the arbitrarily selected reference voltage $V_R$, and the second most significant bit represents $\frac{1}{4}V_R$, the total preload applied to latch 30a and coupled therefrom to upper voltage generator 34 represents $\frac{3}{4}$ of the reference voltage $V_R$, which value is illustrated as being applied to node 21a from voltage generator 34. Resistors 20a, 20b, and 20c are equal in value, and therefore divide the $\frac{3}{4}V_R$ into three parts, so that the voltage across each resistor is $\frac{1}{4}V_R$, and therefore the voltage at node 21b is $\frac{1}{2}V_R$, and the voltage at node 21c is $\frac{1}{4}V_R$. As also illustrated in FIG. 3a, the assumed value of the analog voltage being converted into digital form is $0.63V_R$. This value of the analog voltage is less than $\frac{3}{4}V_R$ but greater than $\frac{1}{2}V_R$. Consequently, comparator array 18 produces a logic 0 value on conductor 22a, and produces a logic 1 level on conductors 22b and 22c. Logic circuit 24 interprets or encodes this value and produces the 2-bit digital word 10 on conductor set 26.

Figure 3A:
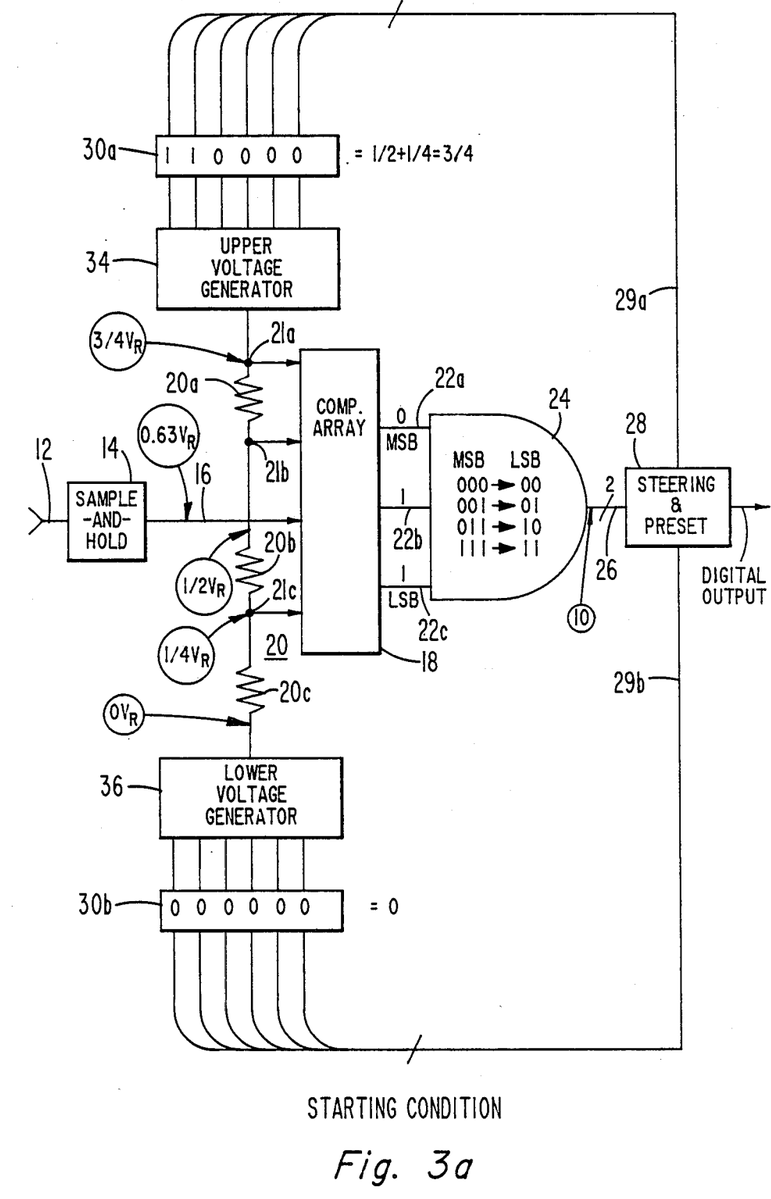
FIGS. 3a–3d, referred to together as FIG. 3, are block diagrams of an embodiment of the invention illustrating the conditions occurring during the course of conversion of an analog signal into a six-bit digital signal two bits at a time over a period of three clock cycles.
Figure 3B:
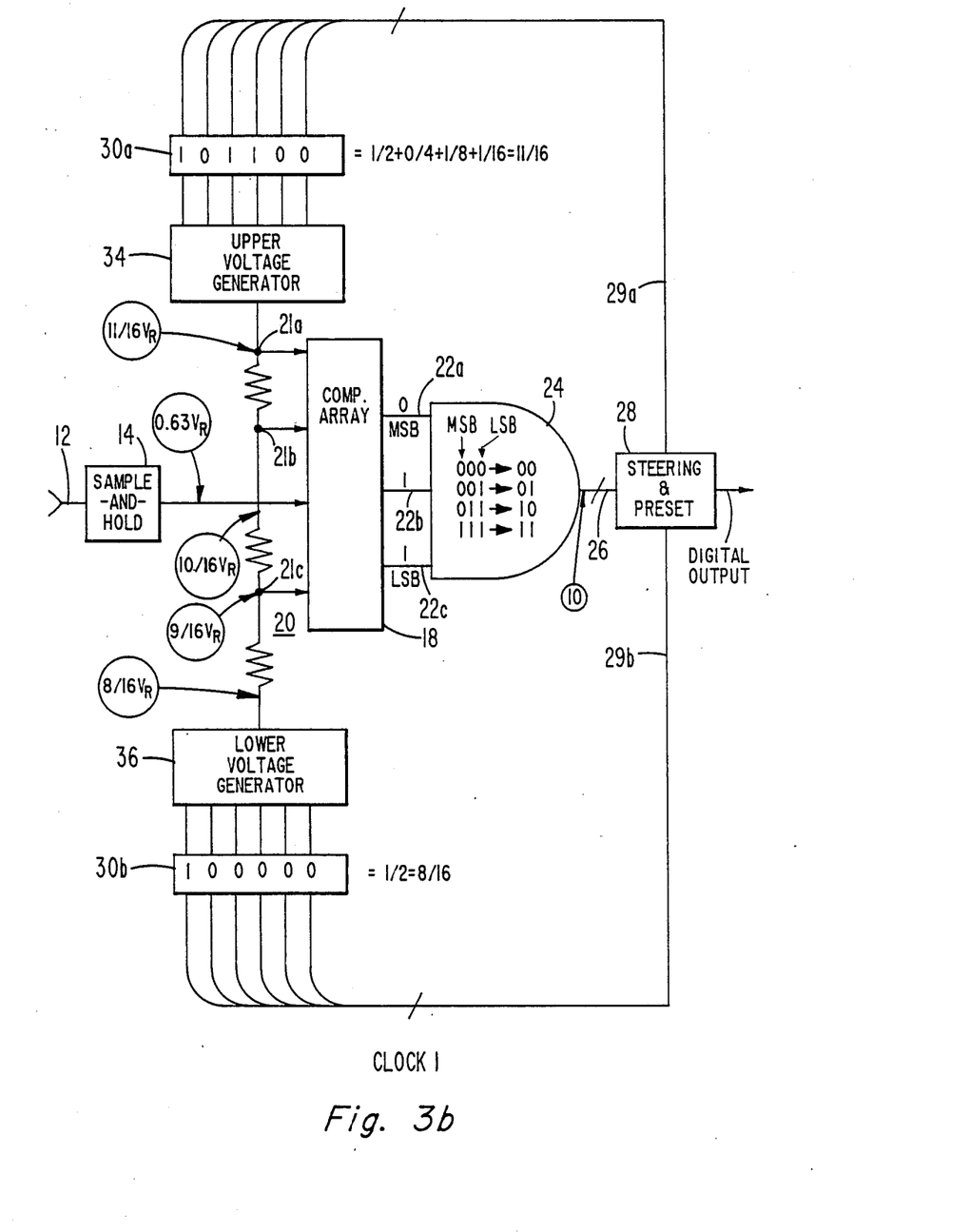

At the first clock pulse following the preset condition, the intermediate digital word 10 produced by logic circuit 24 on conductor set 26 is overwritten by steering and preset circuit 28 into the first two most significant bits (MSB) of latches 30a, thereby changing the two left-most bits from 11 to 10. Also on the first clock pulse the next most significant bit pair (the third and fourth bits), are preset to 11, as illustrated in FIG. 3b. The least significant bit pair remains 00. The digital word residing in latch 30a after the first clock pulse is 101100, which represents 11/16 of the reference voltage $V_R$. Also at the first clock pulse following the preset condition, the intermediate digital word 10 produced by logic circuit 24 on conductor set 26 is overwritten into the first two (MSB) bits of latch 30b. The remaining four bits remain 0000. The digital word residing in latch 30b after the first clock cycle is 100000, as illustrated in FIG. 3b, corresponding to $\frac{1}{2}$ or 8/16 of the refernce voltage. Upper voltage generator 34 responds to the digital word stored in latch 30a by producing a voltage equal to $11/16V_R$ at node 21a of voltage divider 20. Lower voltage generator 36 responds to the digital word stored in latch 30b to produce $8/16V_R$, which is applied to the lower end of voltage divider 20. The difference between $11/16V_R$ and $8/16V_R$ is $3/16V_R$, which voltage divider 20 divides into three parts, so that $1/16V_R$ appears across each resistor. Consequently, $9/16V_R$ is generated at node 21c, and $10/16V_R$ is generated at node 21b, as illustrated in FIG. 3b. Comparator array 18 continues to receive the $0.63V_R$ analog signal from sample-and-hold circuit 14.

During the interval between the first and second clock pulses, the analog signal is compared with the reference voltages produced at nodes 21a, 21b, and 21c. It will be noted that $0.63V_R$ is greater than $9/16V_R$ and 10/16$V_R$, but is less than 11/16$V_R$. Comparator array 18 therefore produces the unencoded word 011 on conductor set 22, which logic circuit 24 interprets or encodes to produce the second intermediate digital word 10 on conductor set 26. It is mere coincidence that the second intermediate digital signal is the same as the first.

Figure 3C:
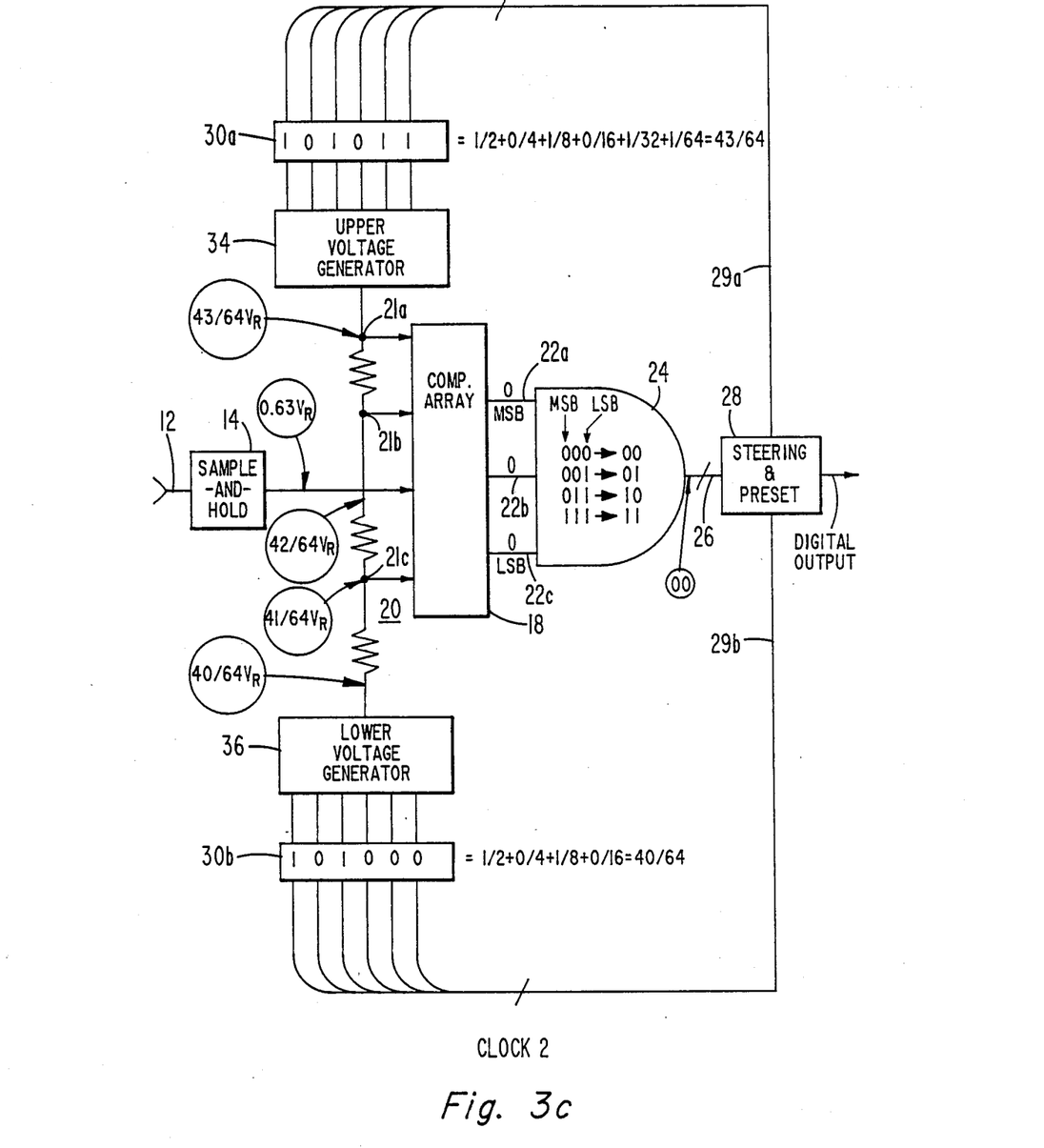

Upon the occurrence of the second clock pulse, the second intermediate digital word 10 produced by logic circuit 24 on conductor set 26 is applied by steering and preset circuit 28 to overwrite the second most significant bit pair (the third and fourth bits) of latches 30a and 30b, without changing or affecting the most significant bit pair. This condition is illustrated in FIG. 3c, in which the most significant bit pair stored in latch 30a remains 10, and the second most significant bit pair has changed from 11 to 10. The least significant bit pair of latch 30a is preset to an all-ones condition at the occurrence of the second clock pulse, with the result that the digital word stored in latch 30a after the second clock pulse is 101011, corresponding to a value of 43/64$V_R$. Similarly, after the second clock cycle, the most significant bit pair stored in latch 30b remains 10, while the second most significant bit pair is updated to a value of 10. However, the least significant bit pair continues to be preset to a value of 00, whereupon the entire word stored in latch 30b after the second clock pulse is 101000, corresponding to 40/64$V_R$.

Figure 3D:
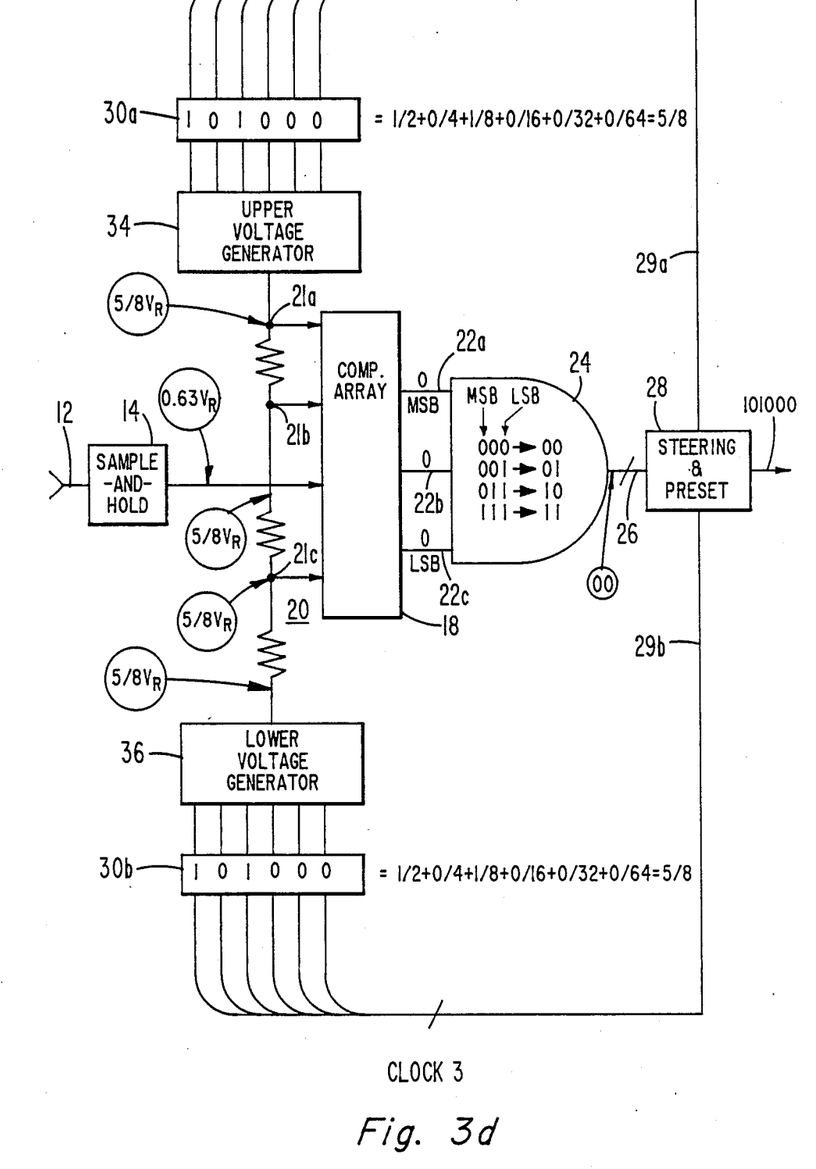

In the interval between the second and third clock cycles, upper voltage generator 34 responds to the digital word then stored in latch 30a to produce a voltage of 43/64$V_R$ at node 21a, as illustrated in FIG. 3c, while lower voltage generator 36 produces 40/64$V_R$ at the lower end of voltage divider 20. The difference between the upper voltage and the lower voltage is 3/64$V_R$, which voltage divider 20 divides into three portions, so that the voltage at node 21c is 41/64$V_R$, and the voltage at node 21b is 42/64$V_R$. The value of analog signal being converted (0.63$V_R$) is less than 41/64$V_R$, whereby comparator array 18 produces all-zeroes on conductors 22a-22c. Logic circuit 24 interprets this value to produce an intermediate digital word 00 on conductor set 26. At the third and last clock pulse, steering and preset circuit 28 applies the then-current third intermediate digital word 00 on conductor set 26 to latches 30a and 30b to overwrite the least significant bit pair contained therein. This condition is illustrated in FIG. 3d. In FIG. 3d, latches 30a and 30b are both illustrated as being loaded with 101000, which represents the analog input signal to within the 6-bit resolution. The digital word 101000 stored in latches 30a and 30b is the desired output signal. The digital words 101000 stored in latches 30a and 30b cause both upper and lower voltage generators to produce 5/8$V_R$.

As described in conjunction with FIG. 3, a 6-bit conversion was performed by an arrangement according to the invention two bits at a time, and three clock cycles were required in order to complete the conversion. A flash converter would have completed the conversion in one clock cycle, but would have required 63 comparators for the same 6-bit resolution, rather than 3 comparators as described. FIG. 4 is similar to FIG. 3, but with the difference that the voltage divider, comparator array, and encoding logic circuit are arranged for 3-bit (eight states) resolution. Since the voltage divider, comparator array, and logic circuit are different from those described in conjunction with FIGS. 2 and 3, they are designated in FIG. 4 by the same reference numerals, but in the 400 series.

Figure 4A:
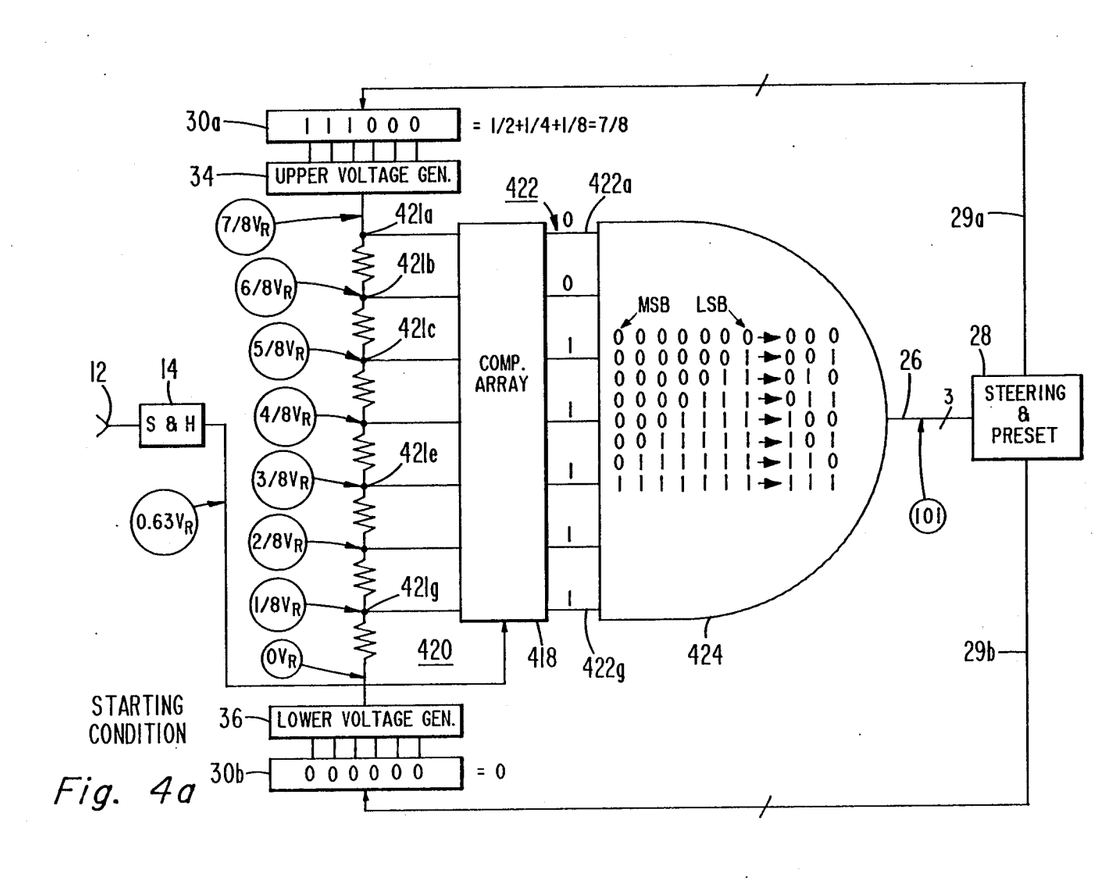
FIGS. 4a–4c are block diagrams similar to FIG. 3 illustrating the conditions occurring during the course of conversion to a six-bit digital signal three bits at a time over a period of two clock cycles.

FIG. 4a illustrates the starting condition prior to the beginning of conversion. As illustrated in FIG. 4a, the most significant bit triplet or three most significant bits of latch 30a are preloaded with all-ones, and the remaining bit triplet or remaining three least significant bits are all-zeroes. The preload in latch 30b is all-zeroes. The preload in latch 30a represents $\frac{7}{8}V_R$. Upper voltage generator 34 responds to the digital word stored in latch 30a to produce $\frac{7}{8}V_R$, and lower voltage generator 36 produces zero volts at the lower end of voltage divider 420. As illustrated, voltage divider 420 includes seven resistors. These resistors have equal values, and divide the applied signal into seven portions. Each resistor produces at its associated node 421 an increment of $\frac{1}{8}V_R$ over the previous node. With an applied analog signal of 0.63$V_R$, as in the case described in conjunction with FIG. 3, comparator array 418 of FIG. 4a produces the digital word 0011111 on conductor set 422, thereby indicating that the applied input signal exceeds the $\frac{5}{8}V_R$ produced at node 421c, but is less than the 6/8$V_R$ produced at node 421b. Logic circuit 424 interprets the digital word 0011111 produced by comparator array 418 to produce the encoded 3-bit intermediate digital word 101 on conductor set 26.

Figure 4B:
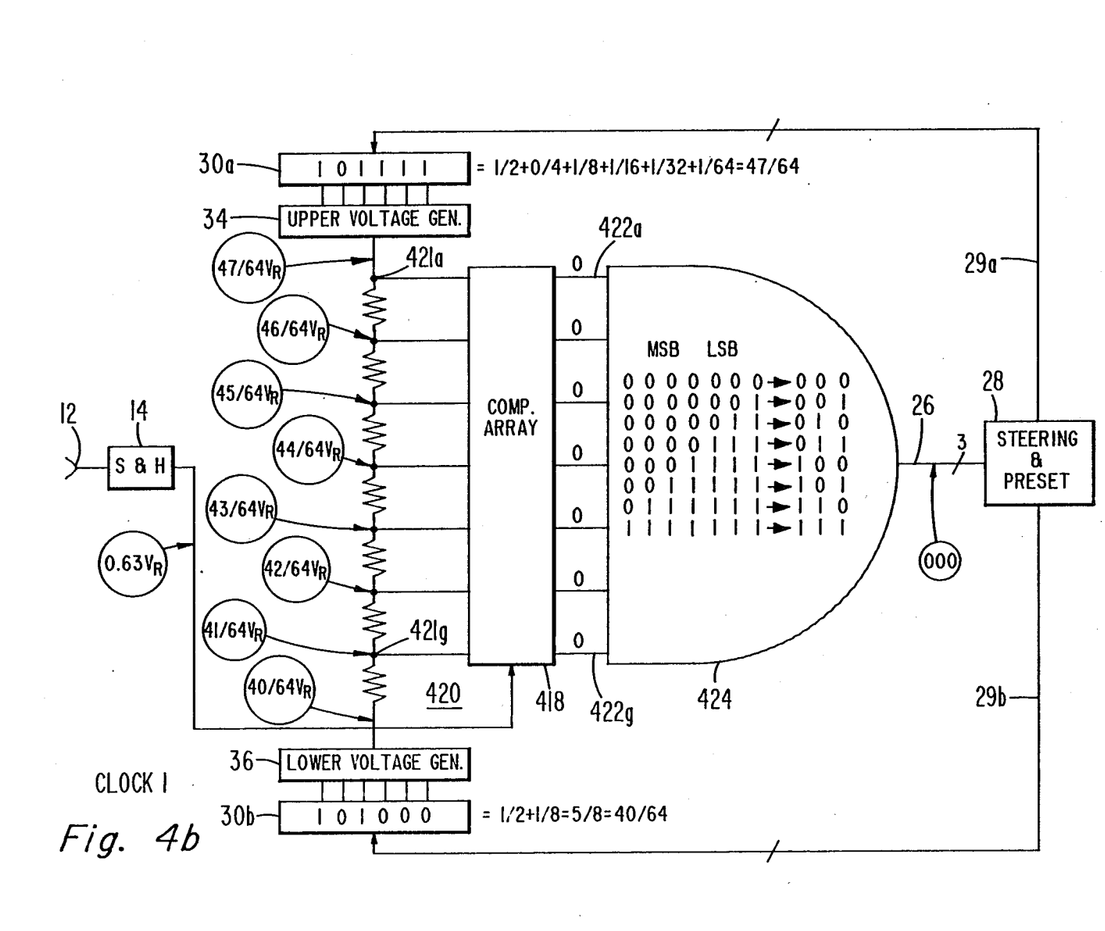

At the next following clock pulse, the three-bit digital word 101 produced on conductor set 26 by logic circuit 424 is applied by steering and preset circuit 28 over conductors 29a and 29b to overwrite the three most significant bits stored in latches 30a and 30b. The condition after the first clock pulse is illustrated in FIG. 4b. In FIG. 4b, latch 30a has 101 overwritten into the three most significant bits. Also, the next three most significant bits are preset to an all-ones condition, with the result that the digital word stored in latch 30a after the first clock pulse is 101111. This value corresponds to 47/64$V_R$. Upper voltage generator 34 produces a voltage of 47/64$V_R$ on node 421a at the upper end of voltage divider 420. Lower latch 30b also has the intermediate digital word 101 overwritten into its three most significant bits. The three least significant bits are preset to an all-zeroes condition, with the result that the digital word stored in latch 30b after the first clock pulse is 101000, corresponding to 40/64$V_R$. Lower voltage generator 36 produces 40/64$V_R$ at the lower end of voltage divider 420. The difference between the upper voltage and the lower voltage is 7/64$V_R$. Voltage divider 420 divides the 7/64 $V_R$ into seven portions, each 1/64 greater than the next. Thus, the voltages at nodes 421a-421g are 47/64$V_R$, 46/64$V_R$ ... 40/64$V_R$. Comparator array 418 compares the 0.63$V_R$ analog signal with the reference voltages applied thereto from voltage divider 420, and produces a digital word 0000000 on conductors 22a-22g. This indicates that 0.63$V_R$ is less than 40/64$V_R$, the least of the reference voltages. Logic circuit 424 interprets this unencoded digital word and produces a corresponding second intermediate word 000 on conductor set 26. At the next clock pulse, steering and preset circuit 28 overwrites the second intermediate digital word 000 into the second most significant bit triplet of latches 30a and 30b, thereby producing the situation illustrated in FIG. 4c.

Figure 4C:
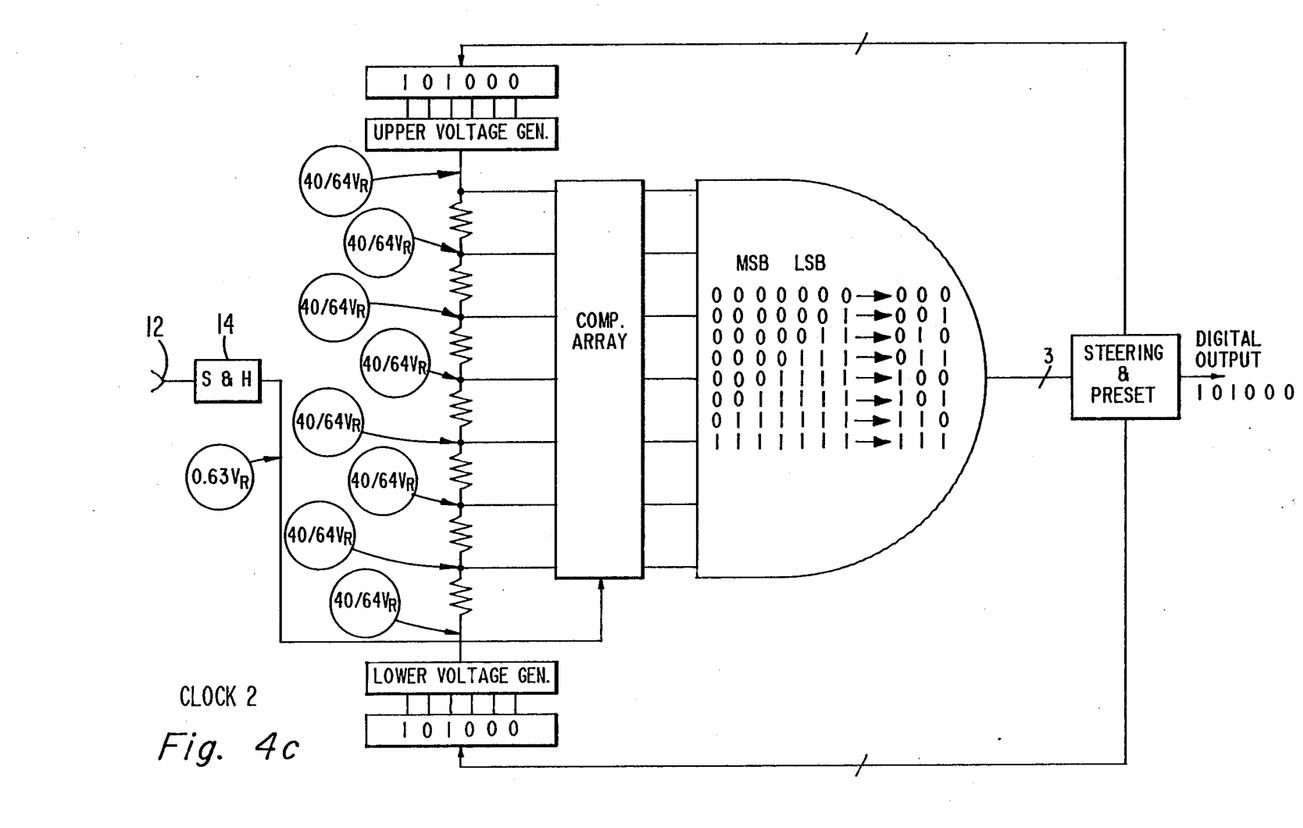

FIG. 4c illustrates the condition after the second and last clock pulse of the conversion. Both latches 30a and 30b are loaded with 101000, which represents the 0.63$V_R$ analog input signal to within 6-bit resolution, and which is used as the 6-bit output signal. Both the upper and lower voltage generators produce 40/64$V_R$. Thus, the embodiment of the invention described in conjunction with FIG. 4 performs N=6 bit conversions within M=2 clock cycles with N/M=6/2=3-bit intermediate digital signals which requires seven comparators, whereas the embodiment described in conjunction with FIG. 3 performs N=6-bit conversion within M=3 clock cycles with N/M=6/3=2-bit intermediate digital signals which requires three comparators. The tradeoffs possible among the embodiments of the invention are advantageous by comparison with prior art arrangements. As described, A-to-D conversion is accomplished without the need for imprecise analog subtraction and amplifiers.

Figure 5:
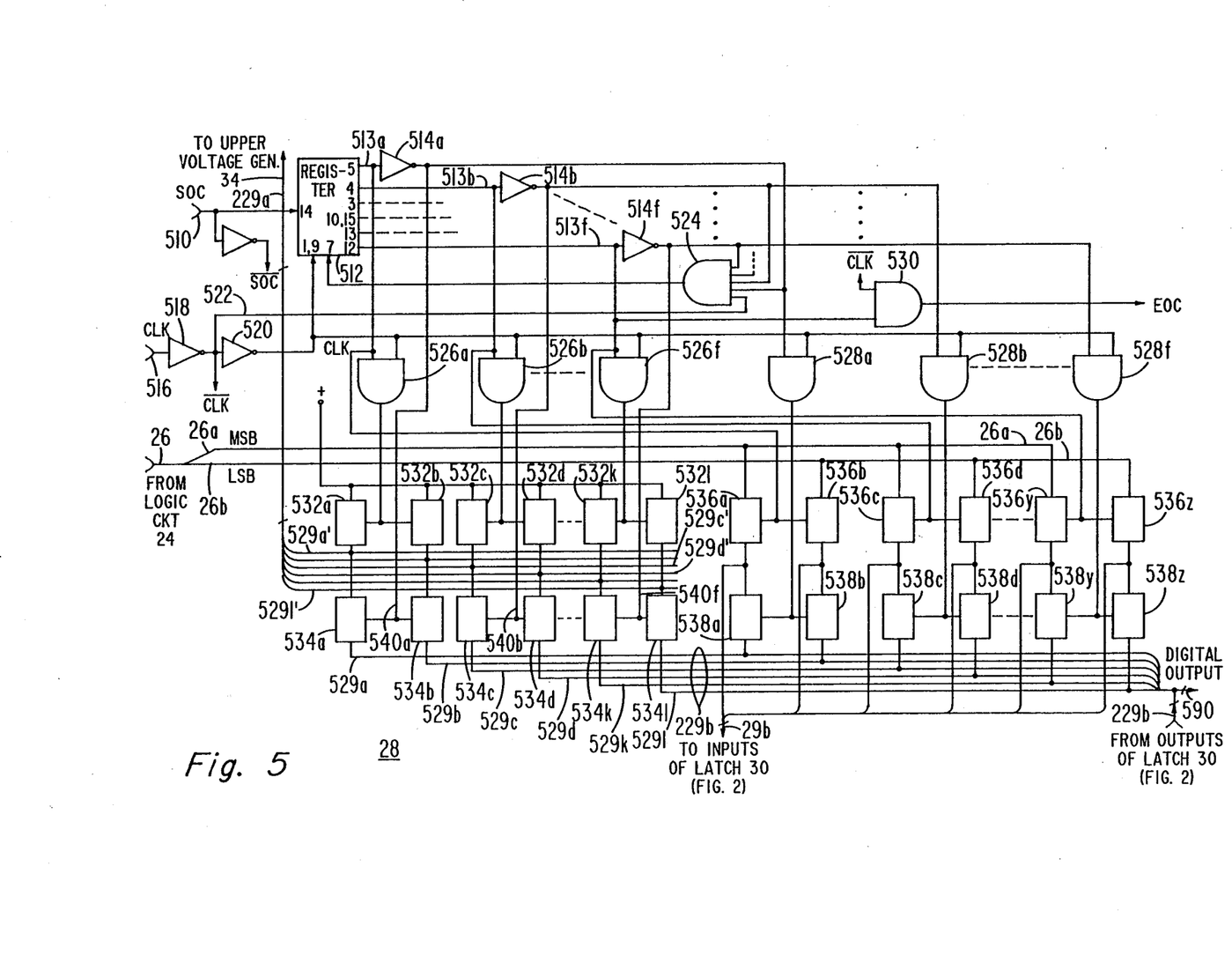
FIG. 5 is a simplified schematic diagram of the switching and present portion of the arrangement of FIG. 1.

FIG. 5 is a simplified block diagram of steering and preset circuit 28 of FIG. 2. Elements of FIG. 5 corresponding to those of FIG. 2 are designated by the same reference numerals. In FIG. 5, a start-of-conversion (SOC) signal represented by a momentary positive-going pulse is applied from a source (not illustrated) by way of an input terminal 510 at the upper left of the FIGURE to a static shift register 512. As illustrated, the SOC pulse is applied to pin 14 for resetting the register to an all-zero condition when register 512 is a type CD4015B integrated circuit manufactured by RCA Corporation Solid State Division. In the reset condition, register 512 sets its output pins 5, 4, 3, 10, 13, 12 and output conductors 513a-f to an all-zero condition. Output pin 10 is connected to input pin 15 in order to configure the integrated circuit register for more than four stages. As illustrated, shift register 512 is configured for 6 stages, each of which represents one clock pulse, corresponding to a 12-bit conversion 2 bits at a time (N=12, M=6), in order to match the arrangement of FIG. 2. Output pin 5 of register 512 is coupled to the input of an inverter 514a, pin 4 is connected to the input of an inverter 514b, and the remaining output pins are coupled to a set of further inverters (not separately illustrated), ending with pin 12 which is connected to inverter 514f. For operation in a six-clock-pulse cycle, there are a total of six inverters 514.

Clock signals are applied from a source (not illustrated) by way of an input terminal 516 to an inverter 518, which produces $\overline{\text{CLK}}$ signals which are used throughout the converter, and the $\overline{\text{CLK}}$ signals are also applied through a further inverter 520 to produce a slightly delayed CLK signal which is used throughout the remainder of steering and preset circuit 28. In the description of FIG. 5, the CLK and $\overline{\text{CLK}}$ signals coact to produce the actions described in conjunction with FIGS. 3 and 4, as being performed generally by the clock signal.

The $\overline{\text{CLK}}$ signal is applied over a conductor 522 to an AND gate 524, the remaining inputs of which are coupled to the outputs of inverters 514. Immediately after reset by the SOC pulse, all the outputs of shift register 512 are logic zero, so the outputs of inverters 514 are all logic one.

The $\overline{\text{SOC}}$ signal is also applied to interconnected pins 1 of registers 230a and 230b (FIG. 2). Registers 230a and 230b are integrated circuit hex D-type flip-flops, type CD40174B, manufactured by RCA Corporation. Each register includes six identical flip-flops having independent data inputs, with common clocking and clear inputs. Two registers are used in order to achieve 12-bit performance. Register 230a may be considered to handle the six MSB, and register 230b the six LSB. The $\overline{\text{SOC}}$ signal is applied to pins 1 before the first clock pulse of the conversion to simultaneously clear the registers, whereby the outputs on pins 2, 5, 7, 10, 12, and 15 of each register (the 12-bit output of latch 30) become logic 0. The 12-bit output of latch 30 is coupled over conductor 229b to pins 4-15 of DAC 244 of lower voltage generator 36. Thus, before the first clock pulse of the first step of conversion, DAC 244 is driven with a 12-bit all-zero signal, as required to produce the $OV_R$ signal described above. Registers 230a and 230b of FIG. 2 also apply the 12-bit all-zero signal on conductor 229b to the digital output, as illustrated in FIG. 5.

A plurality of transmission gates 534a, 534b ... 534l is coupled to conductors 529a, 529b ... 529l contained within conductor 229b. The control input terminals of transmission gates 534a-534l are coupled together in pairs, and the pairs are connected to the outputs of inverters 514. Thus, the control elements of transmission gates 534a and 534b are coupled by a conductor 540a to the output of inverter 514a, the control elements of transmission gates 534c and 534d are connected by a conductor 540b to the output of inverter 514b and the control elements of transmission gates 534k and 534 1 are connected by a conductor 540f to the output of inverter 514f. There are six pairs of transmission gates 534, for a total of twelve gates. Prior to the first clock pulse, the outputs of inverters 514a-514f are logic high, so transmission gates 534 are enabled. The 12-bit output of registers 230a and 230b which appears on conductors 529a-529l of conductor set 229b is coupled to the corresponding conductors 529a'-529l' of conductor set 229a for application to the twelve input pins 4-15 of DAC 240 of upper voltage generator 34 (FIG. 2) and are directly connected to the DAC 244 inputs.

Thus, before the first clock pulse of the conversion, DAC 240 of upper voltage generator 34 (FIG. 2) is also preset to an all-zero condition, and produces zero voltage for the upper end of voltage divider 20.

The first positive-going pulse of the $\overline{\text{CLK}}$ signal following the SOC pulse enables AND gate 524 and applies a logic 1 level to pin 7 of register 512 simultaneously with the $\overline{\text{CLK}}$ pulse. Pin 7 of register 512 is the data input.

At the next following (first) CLK pulse, one-half clock cycle later than the SOC pulse, the logic 1 level then applied to input pin 7 of shift register 512 from AND gate 524 is clocked to the pin 5 output, raising conductor 513a and the input of inverter 514a to a logic 1 condition. The output of inverter 514a goes to a logic low condition, thereby disabling AND gate 524, and also disabling transmission gates 534a and 534b, which decouple the logic 0 level then appearing on conductors 529a and 529b from the two MSB input bits of DAC 240 (FIG. 2). Transmission gates 534c-534f (FIG. 5) continue to couple logic 0 levels to the remaining ten LSB of the input of DAC 240.

At the same time at which transmission gates 534a and 534b are disabled, transmission gates 532a and 532b are enabled by the output of AND gate 526a, responding to the logic 1 level on conductor 513a and the CLK signal. Enabled transmission gates 532a and 532b couple a logic 1 level from the positive + bus to conductors 529a' and 529b' of conductor 229a, thereby substituting a logic 1 level for the logic 0 levels previously applied to the two MSB inputs of DAC 240 of FIG. 2. Thus, immediately after the rising edge of the first CLK pulse, DAC 240 is loaded with the word 110000000000. This constitutes a preset of the MSB input pair of upper voltage generator 34.

A set of AND gates 528b-528f (FIG. 5) is coupled to receive the logic 1 level from the outputs of inverters 514*b*–514*f*, in addition to receiving the CLK pulse. During and after the first CLK pulse, all gates of AND gates 528*a*–528*f* are enabled, except AND gates 528*a*. Only AND gate 528*a* is disabled, because it receives a logic 0 level from the output of inverter 514*a*. AND gates 528*a*–528*f* control a set of transmission gates 538*a*–538*z*. Enabled AND gates 528*b*–528*f* enable transmission gates 538*c*–538*z*, which in turn coupled the logic 0 levels produced by registers 230*a* and 230*b* (FIG. 2) on conductors 529*a*–529 *l* back to corresponding inputs of the registers. Only the two most significant logic 0 bits are not coupled back to the MSB inputs of registers 230*a* and 230*b*, because disabled AND gate 528*a* does not enable transmission gates 538*a* and 538*b*.

Also during and after the first CLK pulse, the logic 1 on conductor 513*a* (FIG. 5) is coupled to enable transmission gates 536*a* and 536*b* of a set of transmission gates 536*a*–536*z*. The remaining transmission gates 536*c*–536*z* are disabled by the logic 0 levels on the remaining outputs of shift register 512 and on conductors 513*b*–513*f*. Transmission gates 536*a* and 536*b* are enabled for receiving the MSB and LSB of the intermediate digital signal from conductors 26*a* and 26*b* and for coupling the intermediate digital signal by way of conductor 29*b* to the MSB and second MSB, respectively, of the input terminals of register 230*a* of latch 30 (FIG. 2).

In the interval between the first CLK and the second $\overline{\text{CLK}}$ pulse, comparators 18 (FIG. 2) perform the appropriate comparisons as described above n conjunction with FIGS. 1–3, and logic circuit 24 produces a two-bit intermediate digital signal on conductor 26, which is coupled over conductors 26*a* (MSB) and 26*b* (LSB) to enabled transmission gates 536*a* and 536*b* (FIG. 5). The system settles in this mode until receipt of the second $\overline{\text{CLK}}$ pulse. Taking as an example the first few steps described in conjunction with FIG. 3, the first intermediate digital word was 10. In this example a logic 1 level appears on conductor 26*a* and a logic 0 level appears on conductor 26*b* (FIG. 5). These are coupled through enabled transmission gates 536*a* and 536*b* to the MSB and second MSB inputs of register 230*a* of latch 30 (FIG. 2), but are not clocked into register 230*a* until the next following positive-going transition of the $\overline{\text{CLK}}$ signal.

Upon receipt of the second $\overline{\text{CLK}}$ pulse, registers 230*a* and 230*b* clock to their outputs the signals then appearing at their inputs. Since transmission gates 536*a* and 536*b* are enabled and 538*a* and 538*b* are disabled, the intermediate digital word 10 is loaded into the two MSB of register 230*a*, and since transmission gates 538*c*–538*z* are enabled and 536*c*–536*z* are disabled, the all-zero condition previously existing at the outputs of the remaining ten LSB of register 230*a* and 230*b* are replicated. Thus, two MSB outputs of register 230*a* are logic 1, 0 and the remainder are logic 0. The word stored in registers 230*a* and 230*b* is coupled by conductor 229*b* to DAC 244 to establish the lower voltage, and the word also appears on conductors 529*a*–529*l*. The intermediate digital word 10 appears on conductors 529*a* and 529*b*, respectively, but is not coupled through disabled transmission gates 534*a* and 534*b*.

Upon receipt of the positive-going transition of the second CLK pulse, shift register 512 (FIG. 5) sets pin 5 and conductor 513*a* to logic 0, and shifts the logic 1 level to output pin 4 and its conductor 513*b*. The output of inverter 514*a* goes to logic 1, and the output of inverter 514*b* goes to a logic 0. AND gate 524 therefore remains disabled (and continues to remain disabled thereafter until the end of conversion). The logic 0 level at the output of inverter 514*b* disables AND gate 528*b* and transmission gate pair 538*c*, 538*d*. This decouples the second-most-significant bit pair (the third and fourth bits) of the input terminals of registers 230*a* and 230*b* (FIG. 2) from the outputs. At the same time, the logic high level on conductor 513*b* enables transmission gates 536*c* and 536*d* (FIG. 5) for coupling the intermediate digital signal from conductors 26*a* and 26*b* to the second-most-significant bit pair of the input terminals of registers 230*a* and 230*b* (FIG. 2). However, this is not clocked into registers 230*a* and 230*b* until a later $\overline{\text{CLK}}$ pulse.

After receipt of the second CLK pulse, transmission gates 532*a* and 532*b* are disabled by the logic 0 level on conductor 513*a*, thereby decoupling the + voltage from conductors 529*b*′ and from the MSB input pair of DAC 240 (FIG. 2). The two MSB pair of DAC 240 are supplied instead with the intermediate digital word (10) by transmission gates 534*a* and 534*b*, which are enabled by the logic 1 level at the output of inverter 514*a*.

Also after receipt of the second CLK pulse, which produced a logic 1 level at output pin 4 of shift register 512 (FIG. 5), the logic 1 level on conductor 513*b* enables AND gate 526*b* to enable transmission gate pair 532*c* and 532*d*, to couple a logic 1 signal from the + bus by way of conductors 529*c*′ and 529*d*′ to the second-most-significant bit position input pair of DAC 240 (FIG. 2). DAC 240 therefore produces the upper voltage based upon a digital input word 101100000000, in which the initial 10 portion is the intermediate digital word, and the 11 portion is the preset. In the interval between the second CLK pulse and the third $\overline{\text{CLK}}$ pulse, the appropriate intermediate digital word is again produced on conductors 26*a* and 26*b*, and is coupled by enabled transmission gate 536*c* and 536*d* (FIG. 5) and conductor 29*b* to the second MSB input pair of registers 230*a* and 230*b*, as mentioned.

At the occurrence of the third $\overline{\text{CLK}}$ pulse, the second intermediate digital word (again 10, using the example of FIG. 3) is clocked into the second MSB pair position of registers 230*a* and 230*b* (FIG. 2). Since transmission gates 538*a*, *b* and *e*–*z* (FIG. 5) are enabled, the bits previously stored in the MSB pair and all other bits except the second MSB pair are replicated, so the output digital word therefrom is 1010000 . . . . This word is applied directly to DAC 244 (FIG. 2) to produce the lower voltage, and is coupled to conductors 529*c* and 529*d* (FIG. 5).

In the interval between the third $\overline{\text{CLK}}$ and the third CLK pulses, the digital word stored in registers 230*a* and 230*b* of latch 30 (FIG. 2) is applied over conductors 529*a*–*l* (FIG. 5), but is not coupled through disabled transmission gates 534*c*, 534*d*. Consequently, the upper voltage does not change.

Upon arrival of the third CLK pulse, shift register 512 transfers the logic 1 output level from pin 4 and conductor 513*b* to pin 3, thereby producing a logic 1 at the output of inverter 514*b*. The logic 1 from inverter 514*b* once again enables AND gate 528*b*, which in turn enables transmission gates 538*c* and 538*d*. Thus, all transmission gates 538 are enabled except one pair (not illustrated) ultimately controlled (by way of an inverter 514 and AND gate 528) by the logic 1 output of pin 3 of shift register 512. This allows the outputs of registers 230*a* and 230*b* (FIG. 2) to be recirculated back to the inputs, except for the third MSB pair (the fifth and sixth bits).

Also, upon the arrival of the third CLK pulse, the logic 1 at output pin 3 of shift register 512 (FIG. 5) enables one transmission gate pair (not illustrated) from among transmission gates 536, to thereby allow the third intermediate digital word to be applied to the third MSB input terminal pair of registers 230a and 230b (FIG. 5). These will not be clocked into registers 230a and 230b until arrival of the next following $\overline{\text{CLK}}$ pulse.

Also during and immediately after the third CLK pulse, the logic high level at the output of inverter 514b and all other inverters 514 except that one (not illustrated) controlled by pin 3 of shift register 512, enables transmission gates 534, except for the third most significant gate pair (not illustrated). The enabled transmission gates 534 couple the currently stored word from registers 230a and 230b (FIG. 2) to be coupled by way of conductors 529 to upper voltage generator 34. The disabled third MSB transmission gate 534 pair prevents the third MSB pair stored in registers 230a and 230b from reaching the third MSB pair position input of the upper voltage generator. Instead, the third MSB pair input receives the + signal by way of an enabled pair (not illustrated) of transmission gates 532. Thus, the third MSB pair of the upper voltage generator is preset.

In the period between the third CLK pulse and the fourth $\overline{\text{CLK}}$ pulse, the third intermediate digital word is formed and is coupled over conductors 29. At the fourth $\overline{\text{CLK}}$ pulse, the third intermediate digital signal is clocked into the third MSB input position of latch 30, and the remaining more and less significant bits (recirculated by gates 538) are replicated.

A the fourth CLK pulse, shift register 512 again steps its output, thereby coupling the outputs of latch 30 (except the fourth MSB pair) back to its input by way of transmission gates 538, and enabling the fourth MSB pair of transmission gates 536 to couple the intermediate digital signal to the fourth MSB pair inputs of latch 30. The outputs of latch 30 continue to be coupled directly to lower voltage generator 36. Also at the fourth CLK pulse, all the transmission gates 534 are enabled, except the fourth MSB pair, to couple the corresponding bits from latch 30 to the corresponding inputs (all except the fourth MSB pair) of upper voltage generator 34. The fourth MSB pair of inputs of upper voltage generator 34 receive logic 1 levels by way of an enabled fourth MSB pair of transmission gates 532. The fifth $\overline{\text{CLK}}$ pulse loads the current intermediate digital signal into the fourth MSB position of latch 30.

The system continues in the above-described fashion, alternately loading the current intermediate digital signal into the N/M most significant bit positions of latch 30 on each $\overline{\text{CLK}}$ pulse, and on the CLK pulses updating all bits of upper voltage generator 34 except the N/M bits of next lesser significance. During this process, the upper and lower voltage generators 34 and 36 coverage toward the input voltage.

At the sixth CLK pulse, shift register 512 raises output pin 12 to logic 1, thereby enabling transmission gates 532k and 532l for presetting the LSB pair of upper voltage generator 34. AND gate 528f is disabled by the logic 0 at the output of inverter 514f, and LSB transmission gate pair 536y, z is enabled. The sixth intermediate digital word is generated, and is coupled to the LSB input pair of latch 30. At the seventh $\overline{\text{CLK}}$ pulse, the LSB intermediate digital word is loaded into latch 30 (FIG. 2), thereby producing at the digital output terminal 590 the desired output digital word corresponding to the input analog signal on conductor 229b.

The EOC pulse is produced by AND gate 530 upon occurrence of the seventh $\overline{\text{CLK}}$ pulse. The EOC pulse resets S&H 14 in readiness for the next conversion, and may be used by circuits following the analog-to-digital converter for gating the digital word.

While the conversion as described required the rising edges of seven $\overline{\text{CLK}}$ pulses, the intervening duration is six clock intervals. It should be noted that the SOC and first CLK pulses may occur immediately before the first CLK pulse, and the seventh $\overline{\text{CLK}}$ pulse immediately after the sixth CLK pulse, so the minimum time only slightly exceeds six clock pulse durations.

Other embodiments of the invention will be apparent to those skilled in the art. While the description of the operation in conjunction with FIG. 3 included the explicit step of overwriting the least significant bits of latches 30a and 30b with the last (the third, in the example of FIG. 3) intermediate digital signal to produce the final convergence of the upper and lower voltages to the value of the analog input voltage, it is apparent that the final convergence takes a finite amount of time, and this time can be saved by combining all but the least most significant bits stored in latches 30a and 30b with the last intermediate digital word in the least significant bits to produce the output signal. While positive logic circuits and operation have been described, negative logic circuits could be used as well in all or portions of the arrangement, whereby logic 1 and logic 0 levels are inverted. While preset to logic 1 levels of only a few bits at a time has been described, all bits of the upper voltage generator may be preset to logic 1 levels, if desired. This changes the voltage relationship somewhat, which may be compensated for, if desired, adding a further resistor between the upper node 21a of voltage divider 20 of FIGS. 1-4 and the associated upper voltage generator 34. One or more further resistors may be added at various points to the voltage divider as known in the art for enabling $\pm\frac{1}{2}$ LSB resolution.

What is claimed is:

1. An analog-to-digital converter for converting an analog signal voltage to a digital output signal comprising:
   digitally controllable first voltage generating means comprising a digital-to-analog converter for producing a first voltage in response to a digital word applied to its input port;
   digitally controllable second voltage generating means comprising a digital-to-analog converter for producing a second voltage in response to a digital word applied to its input port;
   voltage dividing means including a series string of resistors coupled between said first and second voltage generating means for producing three reference voltages related to said first and second voltages;
   comparator and processing means comprising first, second and third comparators coupled to said voltage dividing means and coupled for receiving said analog signal voltage, for comparing said analog signal voltage with the highest, an intermediate, and the lowest one of said reference voltages, respectively, and also comprising means for utilizing the output of said second comparator as the most significant bit of a first intermediate digital signal, and further comprising a first AND gate coupled to said first and third comparators for generating the least significant bit of said first intermediate digital signal under a first condition, and further comprising a second AND gate including a first input terminal coupled to said third comparator, and also including second and third inverting input terminals coupled to said first and second comparators for generating said least significant bit of said first intermediate digital signal under a second condition, and further comprising an OR gate coupled to said first and second AND gates for generating said least significant bit of said first intermediate digital signal;

means for preapplying to said input port of said first voltage generating means a first digital word including a plurality of logic high levels in at least a plurality of the most significant bits for producing a relatively high first voltage at the initiation of conversion;

means for preapplying to said input port of said second voltage generating means a second digital word including a plurality of logic low levels in at least a plurality of the most significant bits for producing a relatively low second voltage at the initiation of conversion, whereby said intermediate digital signal assumes a first value coarsely indicative of the value of said analog signal voltage relative to the difference between said first and second voltages;

substituting means, coupled to said comparator and processing means and to said first voltage generating means for substituting said first value of said intermediate digital signal for at least portions of said first digital word preapplied to said plurality of the most significant bits of said input port of said first voltage generating means whereby said first voltage assumes a value slightly larger than said analog signal voltage, and coupled to said comparator and processing means and to said second voltage generating means for substituting said first value of said intermediate digital signal for at least portions of said second digital word preapplied to said plurality of most significant bits of said input port of said second voltage generating means whereby said second voltage assumes a value slightly smaller than said analog signal voltage, whereby said comparator and processing means generates a second value of said intermediate digital signal;

output digital signal generating means coupled to said comparator and processing means for forming a digital output signal including said first value of said intermediate digital signal in at least portions of said plurality of most significant bits, and said second value of said intermediate digital signal in at least portions of less significant bits of said digital output signal;

a clock signal generator; and clocked gating means coupled to said second comparator and to said OR gate for gating said first intermediate digital signal in response to said clock signal.

* * * * *